(12) United States Patent
Sakamoto et al.

(10) Patent No.: US 10,074,598 B2
(45) Date of Patent: Sep. 11, 2018

(54) SEMICONDUCTOR DEVICE AND MANUFACTURING METHOD THEREOF

(71) Applicant: Mitsubishi Electric Corporation, Tokyo (JP)

(72) Inventors: Ken Sakamoto, Tokyo (JP); Tetsuya Ueda, Tokyo (JP); Keitaro Ichikawa, Tokyo (JP); Yuki Yoshioka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/379,776

(22) Filed: Dec. 15, 2016

(65) Prior Publication Data
US 2017/0345742 A1 Nov. 30, 2017

(30) Foreign Application Priority Data
May 26, 2016 (JP) .................................. 2016-104791

(51) Int. Cl.
*H01L 23/495* (2006.01)
*H01L 21/48* (2006.01)
*H01L 21/56* (2006.01)

(52) U.S. Cl.
CPC .... *H01L 23/49555* (2013.01); *H01L 21/4853* (2013.01); *H01L 21/565* (2013.01);
(Continued)

(58) Field of Classification Search
None
See application file for complete search history.

(56) References Cited

U.S. PATENT DOCUMENTS 5,309,020 A * 5/1994 Murasawa ........ H01L 23/49555
257/685
5,334,872 A * 8/1994 Ueda ..................... H01L 21/565
257/666
(Continued)

FOREIGN PATENT DOCUMENTS

EP 0959494 A1 11/1999
EP 1119037 A2 7/2001
(Continued)

OTHER PUBLICATIONS

An Office Action mailed by the Korean Intellectual Property Office dated Jul. 7, 2018, which corresponds to Korean Patent Application No. 10-2017-0063825 and is related to U.S. Appl. No. 15/379,776; with English Translation.

*Primary Examiner* — Sitaramarao S Yechuri
(74) *Attorney, Agent, or Firm* — Studebaker & Brackett PC

(57) ABSTRACT

A lead frame includes a plurality of circuit patterns which each have a die pad and an electrode terminal portion and are disposed in a band shape, a tie bar, a frame portion and a suspension lead. Cut are a connection portion between electrode terminals and the frame portion, a connection portion between the frame portion and the tie bar at both end portions in a disposition direction of circuit patterns, and a connection portion from a connection part of the frame portion with the tie bar, between the circuit patterns to a part of the frame portion extending in the disposition direction. The electrode terminal portion is bent to extend to a direction of an upper surface of a semiconductor element. The lead frame is collectively resin-sealed while exposing the tie bar and the electrode terminal portion above the tie bar.

14 Claims, 6 Drawing Sheets

(52) U.S. Cl.
CPC .... *H01L 23/4952* (2013.01); *H01L 23/49537* (2013.01); *H01L 23/49541* (2013.01); *H01L 23/49548* (2013.01); *H01L 23/49575* (2013.01); *H01L 23/49586* (2013.01); *H01L 2224/48137* (2013.01); *H01L 2224/48247* (2013.01); *H01L 2224/4903* (2013.01); *H01L 2224/49175* (2013.01)

(56) References Cited

U.S. PATENT DOCUMENTS

| | | | |
|---|---|---|---|
| 6,313,598 | B1 | 11/2001 | Tamba et al. |
| 9,029,994 | B2 | 5/2015 | Ueda et al. |
| 2004/0018663 | A1* | 1/2004 | Michii ............. H01L 23/49541 438/112 |
| 2006/0022331 | A1* | 2/2006 | Shinohara ........... H01L 23/4334 257/718 |
| 2011/0298121 | A1* | 12/2011 | Nishibori ............... H01L 23/24 257/713 |
| 2012/0098138 | A1* | 4/2012 | Oka ....................... H01L 21/56 257/773 |
| 2014/0210093 | A1* | 7/2014 | Wang ..................... H01L 23/36 257/773 |
| 2014/0332942 | A1* | 11/2014 | Kanemoto ............. H01L 24/85 257/676 |

FOREIGN PATENT DOCUMENTS

| | | |
|---|---|---|
| JP | H10-116962 A | 5/1998 |
| JP | 2000-091499 A | 3/2000 |
| JP | 2002-033433 A | 1/2002 |
| JP | 2012-256746 A | 12/2012 |

* cited by examiner

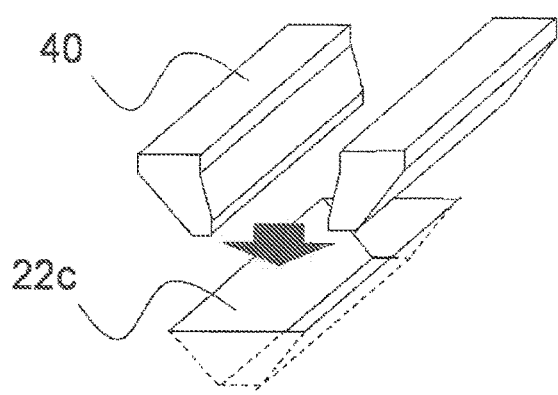
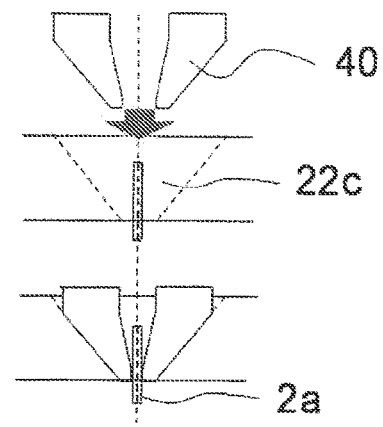
FIG. 11A        FIG. 11B
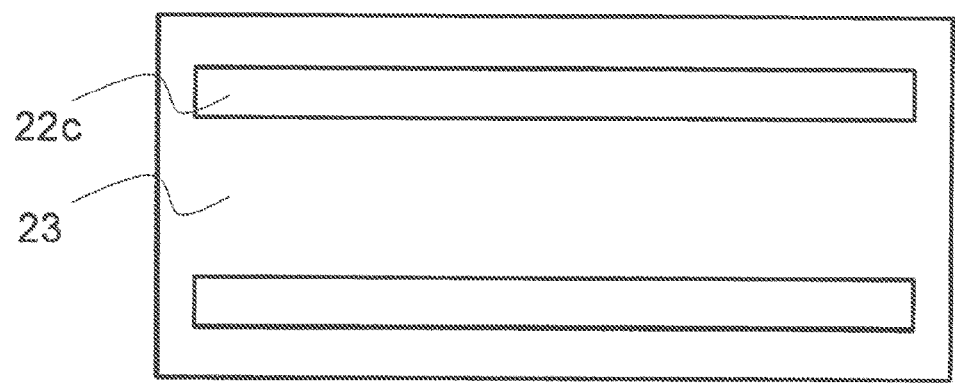
FIG. 11C

SEMICONDUCTOR DEVICE AND MANUFACTURING METHOD THEREOF

BACKGROUND OF THE INVENTION

Field of the Invention

The present invention relates to a manufacturing method of a semiconductor device, and more particularly, to a manufacturing method of a semiconductor device in which electrode terminals are arranged so as to extend on an upper surface of a semiconductor element.

Description of the Background Art

In recent years, power semiconductor devices have an increasing demand for down-sizing of a device for the purpose of cost reduction and a reduction in an arrangement area on a printed board. In a typical semiconductor device in which an electrode terminal extends on a side surface of the semiconductor device (in a direction parallel to a top surface of a semiconductor element), an arrangement area is increased with an increase in the number of semiconductor elements to be arranged on a printed board. Therefore, there is proposed a method of manufacturing a semiconductor device which enables down-sizing of a semiconductor device and a reduction in an arrangement area on a printed board by configuring an electrode terminal not to extend on a side surface of the semiconductor device but extend on an upper surface (in a direction vertical to the top surface of a semiconductor element).

The manufacturing method of the semiconductor device recited in Japanese Patent Application Laid-Open No. 2002-33433 is directed to the semiconductor device having an electrode terminal extending on an upper surface of a semiconductor element. However, the method has a problem of deterioration of production efficiency because a plurality of semiconductor devices cannot be manufactured collectively from a single lead frame from a lead forming step to a resin sealing step.

SUMMARY OF THE INVENTION

The present invention has been made in order to solve the above-described problem and aims at providing a method of efficiently manufacturing a plurality of semiconductor devices collectively from a single lead frame for a semiconductor device in which an electrode terminal extends on an upper surface of a semiconductor element.

A manufacturing method of a semiconductor device according to the present invention includes a die bonding step of bonding a semiconductor element to a die pad of a lead frame. The lead frame includes a plurality of circuit patterns which each have the die pad and an electrode terminal portion provided around the die pad and are disposed in a band shape; a tie bar which connects a plurality of electrode terminals configuring the electrode terminal portion and extends in a disposition direction of the circuit patterns; a frame portion which has a partition frame between the circuit patterns, is connected to the plurality of electrode terminals and both end portions of the tie bar and is arranged so as to surround the circuit patterns; and a suspension lead which connects the frame portion and the die pad in the disposition direction of the circuit patterns. The manufacturing method includes a wire bonding step of electrically connecting the semiconductor element and the plurality of electrode terminals by a metal wire; a lead forming step of cutting a connection portion between end portions of the plurality of electrode terminals and the frame portion, a connection portion between the frame portion and the tie bar at both end portions in the disposition direction of the circuit patterns, and a connection portion from a connection part of the frame portion with the tie bar, the part being between the circuit patterns, to a part of the frame portion extending in the disposition direction of the circuit patterns, and bending a part of the electrode terminal portion between the tie bar and the die pad to make an end portion of the electrode terminal portion including the tie bar extend in a direction to which an upper surface of the semiconductor element faces; a resin sealing step of sealing the lead frame with a resin so that a part of the electrode terminal portion, the part being positioned above the tie bar in the direction to which the upper surface of the semiconductor element faces, and the tie bar are exposed; and a lead cutting step of cutting between the circuit patterns to be separated into an individual semiconductor device.

The manufacturing method of the semiconductor device according to the present invention enables improvement in production efficiency because a plurality of semiconductor devices, each of which has an electrode terminal extending on the upper surface of the semiconductor element, are manufactured collectively from a single lead frame from the lead forming step to the resin sealing step.

These and other objects, features, aspects and advantages of the present invention will become more apparent from the following detailed description of the present invention when taken in conjunction with the accompanying drawings.

BRIEF DESCRIPTION OF THE DRAWINGS

FIG. 11A is a perspective view showing a configuration of a movable clamp in a resin sealing step in the manufacturing method of the semiconductor device according to the first preferred embodiment;

FIG. 11B is a plan view showing the configuration of the movable clamp in the resin sealing step in the manufacturing method of the semiconductor device according to the first preferred embodiment; and FIG. 11C is a view showing a clamp position in the resin sealing metal mold in the resin sealing step in the manufacturing method of the semiconductor device according to the first preferred embodiment.

DESCRIPTION OF THE PREFERRED EMBODIMENT

First Preferred Embodiment

Figure 1:
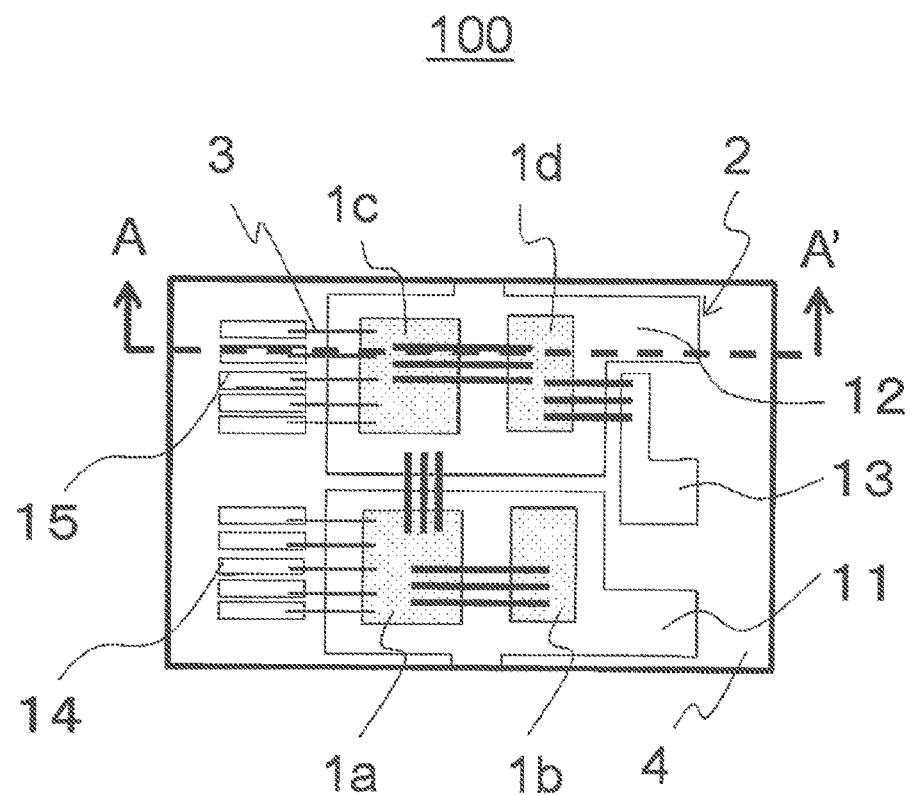
FIG. 1 is a plan view showing a semiconductor device manufactured by a manufacturing method of a semiconductor device according to a first preferred embodiment.

A manufacturing method of a semiconductor device in a first preferred embodiment will be described. FIG. 1 is a plan view showing a semiconductor device manufactured by the manufacturing method of the semiconductor device according to the first preferred embodiment. A semiconductor device 100 is configured with semiconductor elements 1a, 1b, 1c and 1d electrically connected by soldering or a metal wire 3 or the like on a lead frame 2 and sealed by a resin 4. Examples of the semiconductor element include an IGBT, a diode, a MOSFET and the like.

In the circuit shown in FIG. 1, the IGBT 1a and the diode 1b configure a parallel circuit and the IGBT 1c and the diode 1d configure a parallel circuit. These circuits are electrically connected in series to configure an inverter circuit. An electrode terminal is configured with main terminals 11, 12 and 13, and control terminals 14 and 15 and functions as a current path. The main terminal 11 is electrically connected to a collector electrode of the IGBT 1a and to an anode electrode of the diode 1b. An emitter electrode of the IGBT 1a and a cathode electrode of the diode 1b are electrically connected by wire bonding. The control terminal 14 and a gate electrode (not shown) of the IGBT 1a are electrically connected by wire bonding. Further, the emitter electrode of the IGBT 1a and the main terminal 12 are electrically connected by wire bonding. The main terminal 12 is electrically connected to a collector electrode of the IGBT 1c and to an anode electrode of the diode 1d, and an emitter electrode of the IGBT 1c and a cathode electrode of the diode 1d are electrically connected by wire bonding. Additionally, the control terminal 15 is electrically connected to a gate electrode (not shown) of the IGBT 1c by wire bonding. Further, the cathode electrode of the diode 1d is electrically connected to the main terminal 13 by wire bonding. The number of semiconductor elements is not limited to four but is any arbitrary number.

Figure 2:
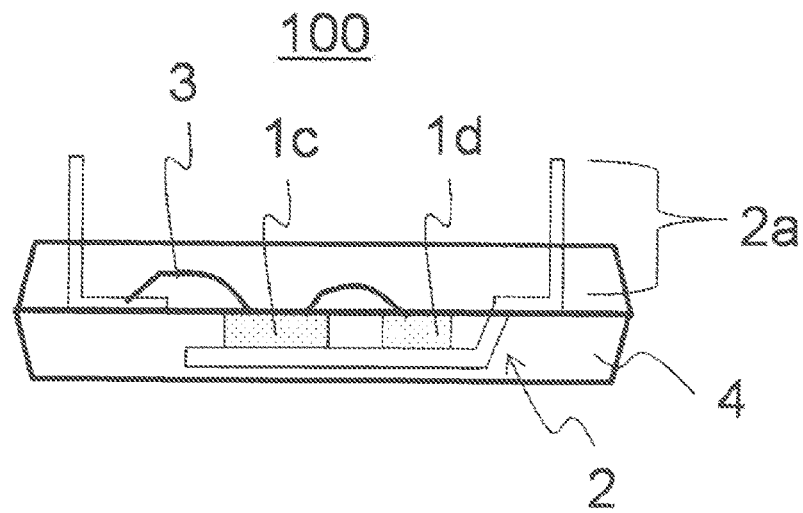
FIG. 2 is a sectional view of the semiconductor device in FIG. 1 taken along a line A-A' according to the first preferred embodiment.

FIG. 2 is a sectional view of the semiconductor device in FIG. 1 taken along a line A-A'. An electrode terminal portion 2a of the lead frame is arranged so as to extend on an upper surface of the semiconductor device (in a direction vertical to a top surface of the semiconductor element) and is exposed to the outside of the resin 4. With such a configuration, no protrusion of an electrode terminal in a direction of a side surface of the semiconductor device allows for size-reduction of the semiconductor device. Further, when a thus configured semiconductor device is arranged on an external board, an effect of reduction in an arrangement area can be obtained. In the following, a manufacturing method of the semiconductor device 100 will be described.

Figure 3:
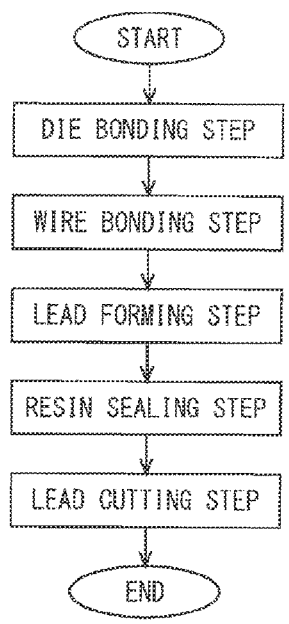
FIG. 3 is a flow chart of the manufacturing method of the semiconductor device according to the first preferred embodiment.
Figure 4:
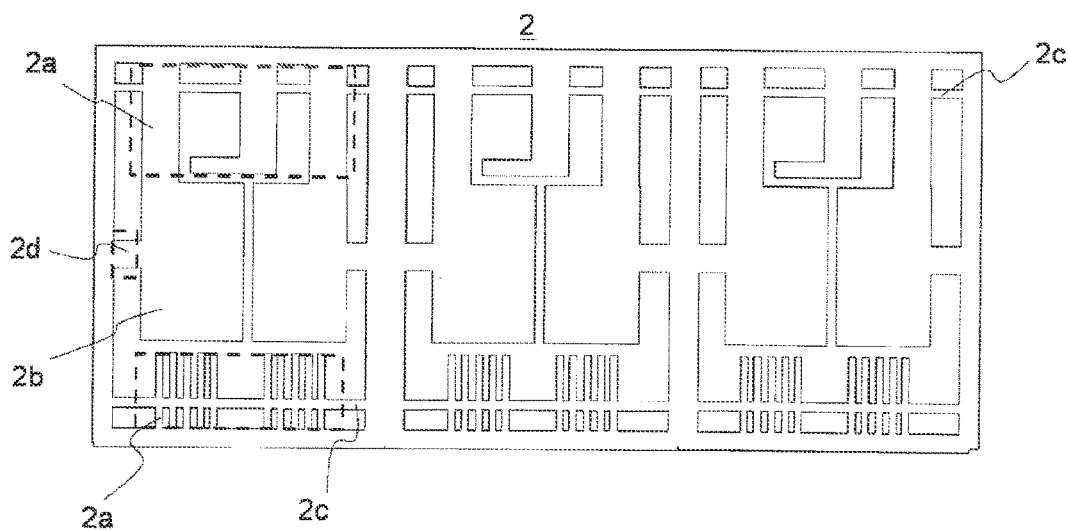
FIG. 4 is a plan view of a lead frame in the semiconductor device manufactured by the manufacturing method of the semiconductor device according to the first preferred embodiment.
Figure 5:
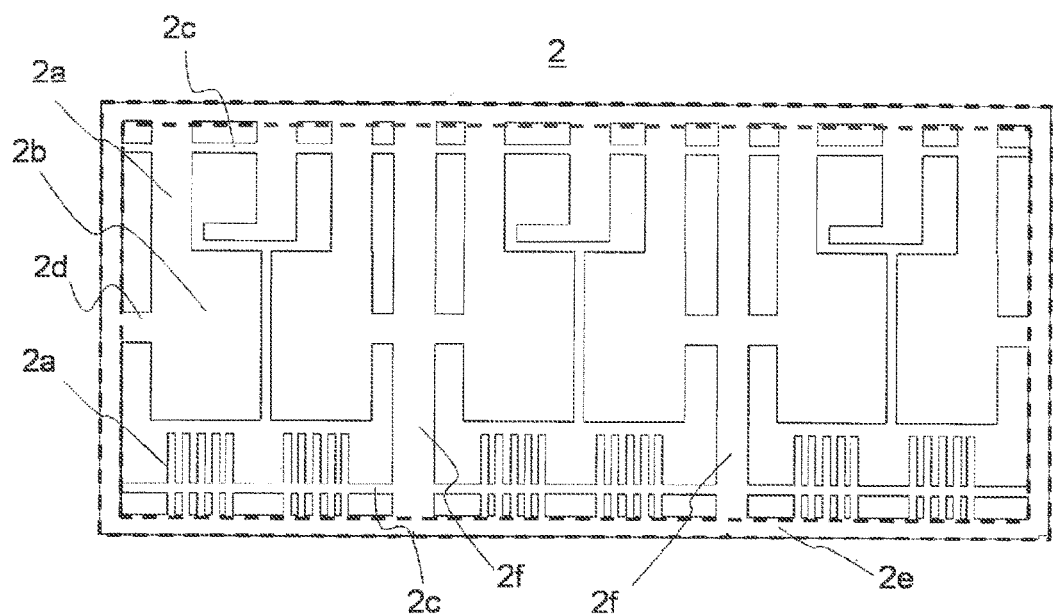
FIG. 5 is a plan view of a lead frame showing a framework in the semiconductor device manufactured by the manufacturing method of the semiconductor device according to the first preferred embodiment.

FIG. 3 is a flow chart of the manufacturing method of the semiconductor device according to the first preferred embodiment, and FIG. 4 and FIG. 5 are plan views of a lead frame for use in the manufacturing method of the semiconductor device according to the first preferred embodiment, with FIG. 4 showing a part to be an electrode terminal portion of the semiconductor device and FIG. 5 showing a part of a framework respectively by broken lines.

On the basis of FIG. 4 and FIG. 5, the lead frame will be described. On the lead frame 2, circuit patterns corresponding to individual semiconductor devices are arranged in a row such that the individual electrode terminals extend in a direction corresponding to a side surface, i.e. the plurality of circuit patterns are disposed in a row in a band shape. A side surface portion with respect to the disposition direction corresponds to a part to be bent at a lead forming step which will be described later. A material of the lead frame 2 is, for example, copper, but may be other metallic material having excellent conductivity.

As components of the lead frame 2, there are integrally provided the electrode terminal portion 2a and a die pad portion 2b which provide a circuit pattern corresponding to an individual semiconductor device, a tie bar 2c, a suspension lead 2d, a framework 2e, and a partition frame 2f. The framework 2e and the partition frame 2f will be collectively referred to as a frame portion. The electrode terminal portion 2a is a part corresponding to the main terminals 11, 12 and 13 and the control terminals 14 and 15 as described with reference to FIG. 1 and is configured with a plurality of electrode terminals.

On the other hand, the die pad portion 2b is a mounting part for a semiconductor element to be mounted on the lead frame. The tie bar 2c is disposed between two electrode terminals adjacent to each other in the electrode terminal portion 2a to connect the electrode terminals. Specifically, each electrode terminal portion 2a and the frame portion are connected by each tie bar 2c extending in a direction at right angles to the direction in which the individual electrode terminals extend. Additionally, in the lead frame 2, the respective tie bars 2c corresponding to the respective semiconductor devices, when seen as the lead frame as a whole, are arranged so as to be linear in the disposition direction.

The framework 2e in FIG. 5 represents a range surrounded by two broken lines and is a part to be used when a plurality of semiconductor devices are conveyed on a lead frame basis. Here, for explicitly showing the framework 2e, the framework is illustrated not in FIG. 4 but in FIG. 5 by the broken lines. Further, a region surrounded by the framework 2e is divided into circuit pattern regions corresponding to the semiconductor devices by the partition frames 2f. In the disposition direction, the partition frames 2f cross the tie bar 2c to be connected to each other. The suspension lead 2d is provided between the frame portion (the framework 2e and the partition frame 2f) and the die pad 2b and serves a function of supporting the die pad portion 2b while cooperating with the partition frame 2f and the tie bar 2c at each step in manufacturing on a lead frame basis.

Next, each step in FIG. 3 will be described. First, at a die bonding step, the semiconductor elements 1a, 1b, 1c and 1d are bonded to the die pad portion 2b by soldering. Subsequently, at a wire bonding step, electrodes (not shown) on the side of top surfaces of the semiconductor elements 1a, 1b, 1c, 1d and the electrode terminal portion 2a are electrically connected by the metal wire 3, and an electrode of the semiconductor element 1a and the electrode on the top surface of the semiconductor element 1b are electrically connected by the metal wire 3, and an electrode of the semiconductor element 1c and the electrode on the top surface of the semiconductor element 1d are electrically connected by the metal wire 3.

Figure 6:
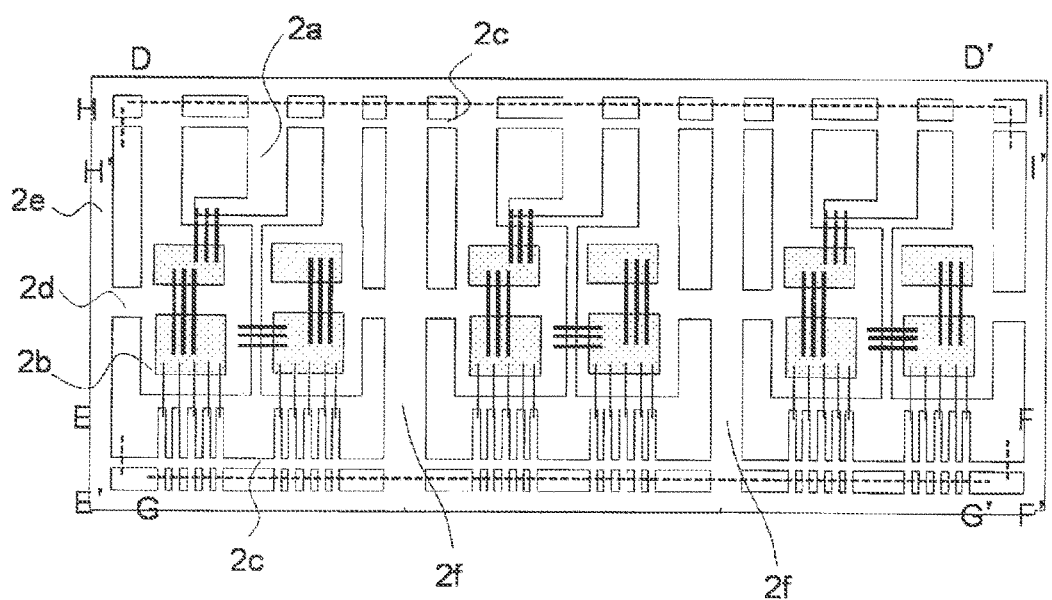
FIG. 6 is a plan view showing a configuration of the semiconductor device after a wire bonding step in the manufacturing method of the semiconductor device according to the first preferred embodiment.
Figure 7:
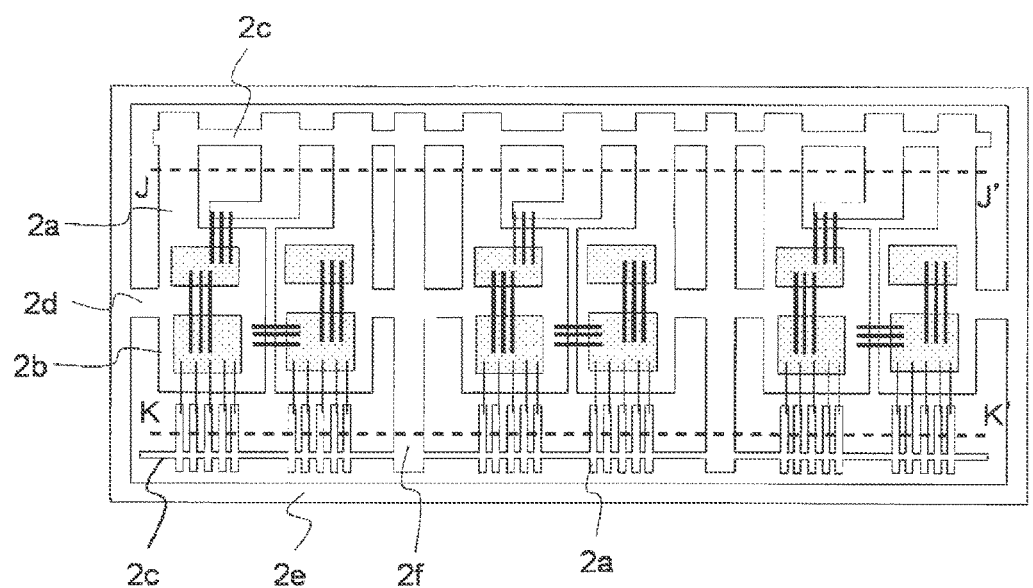
FIG. 7 is a plan view showing a configuration of the semiconductor device after cutting out the framework in the manufacturing method of the semiconductor device according to the first preferred embodiment.
Figure 8:
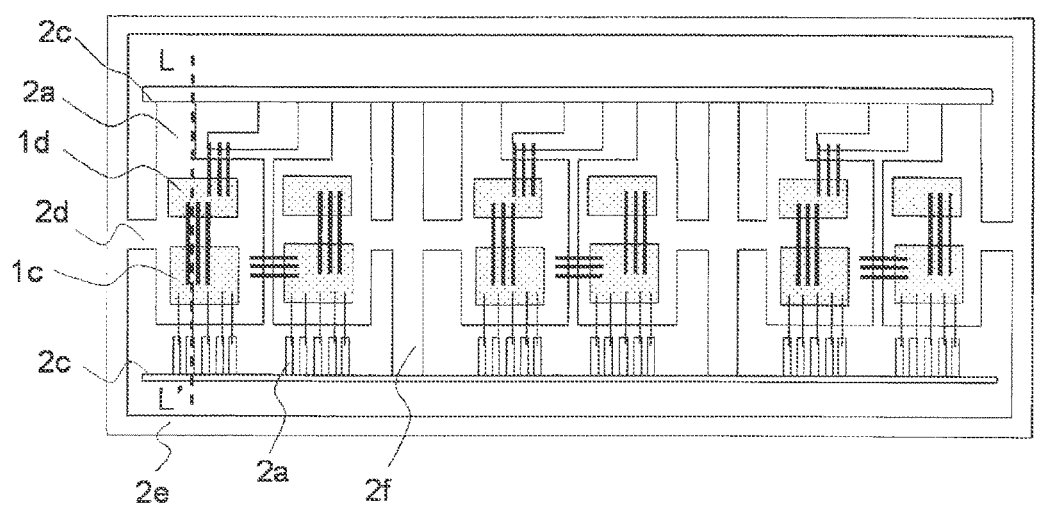
FIG. 8 is a plan view showing a configuration of the semiconductor device after a lead forming step in the manufacturing method of the semiconductor device according to the first preferred embodiment.
Figure 9:
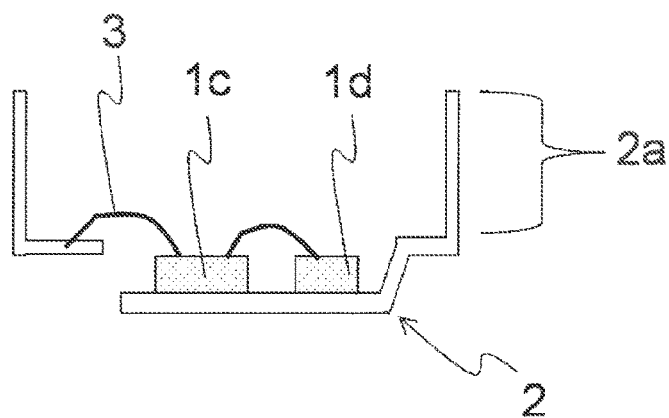
FIG. 9 is a sectional view of the semiconductor device in FIG. 8 taken along a line L-L' according to the first preferred embodiment.

Subsequently, a lead forming step will be described. FIG. 6 is a plan view showing a configuration of the semiconductor device after the wire bonding step, FIG. 7 is a plan view showing a configuration of the semiconductor device after cutting out the framework at the lead forming step, FIG. 8 is a plan view showing a configuration of the semiconductor device after the lead forming step, and FIG. 9 is a sectional view of the semiconductor device in FIG. 8 taken along a line L-L'.

While at the lead forming step, the electrode terminal portion 2a is bent, at a stage preceding the bending, the electrode terminal portion 2a, the tie bar 2c, and the partition frame 2f are cut out from the framework 2e of the lead frame 2.

Positions at which the electrode terminal portion 2a, the tie bar 2c, and the partition frame 2f are cut out from the framework 2e are denoted by a line D-D', a line E-E', a line F-F', a line G-G', a line H-H' and a line I-I', along which lines the lead frame is cut. Cutting is made by punching or the like. The suspension lead 2d connects to the die pad portion 2b from the framework while cooperating with the partition frame 2f and the tie bar 2c, thereby supporting the die pad portion 2b. Accordingly, at a time of cutting at the above cut-out position, drop of the electrode terminal portion 2a or the die pad portion 2b from the lead frame due to cutting can be prevented.

Adopting such a lead frame configuration as described above also suppresses deformation of the electrode terminal portion 2a or the die pad portion 2b and enables the electrode terminal portion 2a to be bent without bending the framework 2e. Setting the suspension lead 2d to have a large thickness and have a width within a fixed range enables the die pad portion 2b to be more firmly supported. The suspension lead 2d is preferably configured to have the thickness of 0.4 to 0.7 mm and the width of 10 to 20 mm. Further, as shown in FIG. 9, providing the suspension lead 2d with a step parallel to a direction orthogonal to the disposition direction enables the die pad portion 2b to be more firmly supported. A radius of curvature R of the step is preferably 0.3 mm or more.

After cutting out the electrode terminal portion 2a, the tie bar 2c, and the partition frame 2f between the circuit patterns from the framework 2e, the electrode terminal portion 2a is bent so as to be in a direction extending on an upper surface of the semiconductor element. Bending positions are denoted by a line J-J' and a line K-K' in FIG. 7. The electrode terminal is bent so that the electrode terminal is positioned to protrude outside the resin when the semiconductor device is completed as shown in FIG. 2.

The electrode terminal portion 2a is bent within a range inside of the tie bar 2c (a semiconductor element side) and outside of a connection position between the metal wire and the electrode terminal portion 2a. After the electrode terminal portion 2a is bent, as shown in FIG. 9, the electrode terminal portion 2a extends on the upper surface of the semiconductor element. A method of bending the electrode terminal portion 2a may be any of roller bending and cam bending.

By contrast, since the framework 2e is not bent, a part of the framework 2e can be used as a handling region, so that the plurality of semiconductor devices can be resultantly conveyed integrally with the lead frame with ease. Specifically, at a time of conveyance of the lead frame 2, the lead frame is conveyed by such operation as grapping, pushing, or drawing the framework. Further, providing the framework 2e with a dent or a hole for positioning (not shown) enables an increase in a positioning precision at the time of conveyance of the lead frame, thereby resultantly facilitating readjustment of a position of a conveyance destination at each step to allow smooth processing.

Figure 10:
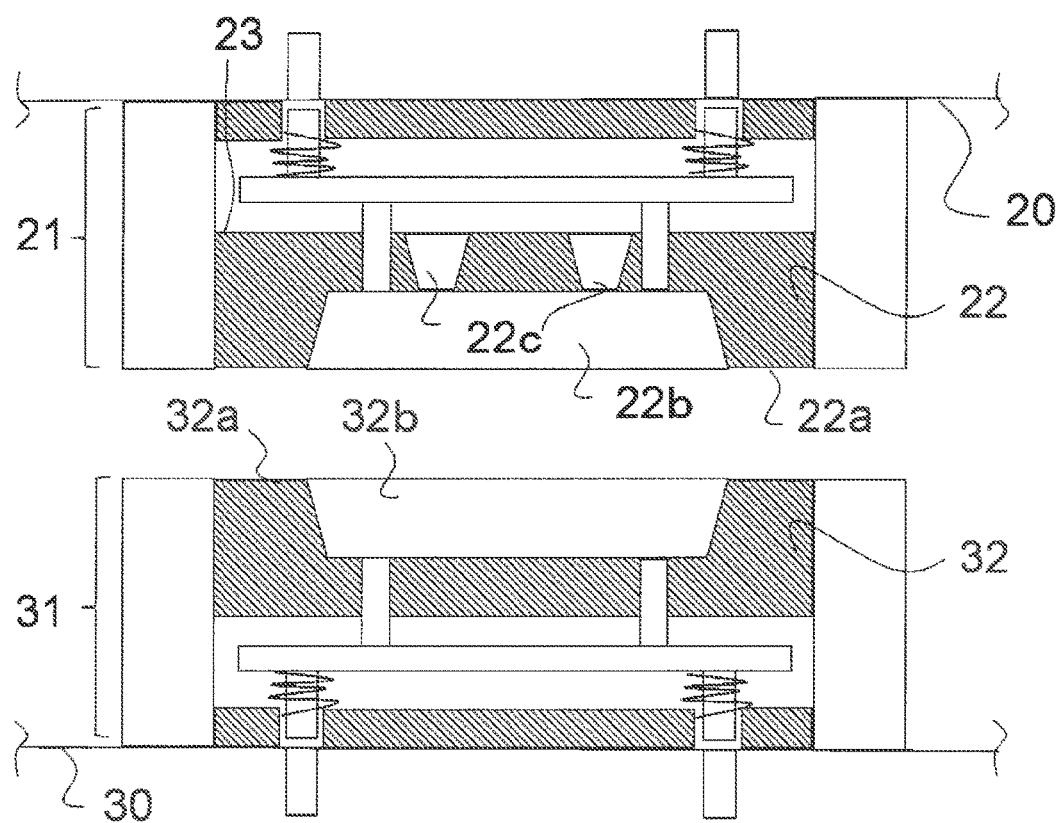
FIG. 10 is a sectional view showing a configuration of a resin sealing metal mold in the manufacturing method of the semiconductor device according to the first preferred embodiment.

Subsequently, a resin sealing step will be described. FIG. 10 is a sectional view showing a configuration of a resin sealing metal mold used at the resin sealing step in the manufacturing method of the semiconductor device according to the present first preferred embodiment. The resin sealing metal mold in FIG. 10 includes, as a pair of upper and lower metal molds, an upper metal mold 21 provided on an upper mold surface plate 20, and a lower metal mold 31 provided on a lower mold surface plate 30. Mating an upper metal mold parting surface 22a of an upper metal mold cavity block 22 as a part of the upper metal mold 21 with a lower metal mold parting surface 32a of a lower metal mold cavity block 32 as a part of the lower metal mold 31 forms a metal mold internal space (a space formed by 22b and 32b). Then, in the metal mold internal space, a remaining part other than a front end portion of the electrode terminal portion 2a, the tie bar 2c and a front end portion of the partition frame 2f is housed. In parallel with the housing work, in a terminal hole 22c communicating with the metal mold internal space, the front end portion of the electrode terminal portion 2a, the tie bar 2c and the front end portion of the partition frame 2f are arranged (inserted). Since the framework 2e and the electrode terminal portion 2a are separated so as to coincide with the metal mold internal space at the lead forming step, the plurality of semiconductor devices configured with the electrode terminals extending on the upper surfaces of the semiconductor elements can be collectively resin-sealed while being connected by the framework.

FIG. 11A and FIG. 11B are a perspective view and a plan view, respectively, each showing a configuration of a movable clamp used in the resin sealing step. FIG. 11C is a view showing a clamp position in the resin sealing metal mold. A metal mold upper surface 23 represents an upper surface of the resin sealing metal mold and includes a terminal hole 22c. The front end portion of the electrode terminal portion 2a, the tie bar 2c and the partition frame 2f, which protrude externally from the resin sealing metal mold through the terminal hole 22c, are clamped by a movable clamp 40 to engagedly hold the tie bar 2c, and a top surface and a back surface of a peripheral portion thereof, and engage at least a part of the movable clamp 40 in the terminal hole 22c, thereby substantially cutting off a space on one end side of the electrode terminal portion 2a and a space on the other end side (front end portion side) of the electrode terminal portion 2a from each other.

After the clamping, a liquid resin is injected from the one end side of the electrode terminal portion 2a. A manufacturing method using a movable clamp enables suppression of outflow of a liquid resin to the other end side of the electrode terminal portion 2a. Specifically, the tie bar 2c or the like can suppress adhesion or burying of the other end (front end portion) of the electrode terminal portion 2a to/in a liquid resin to be a transfer mold resin.

At the time of injection of a liquid resin, the liquid resin to be a transfer mold resin (FIG. 1) is injected through a gate (not shown) as a resin injection port into the metal mold internal space. Applicable as a resin to be injected is, for example, a thermosetting resin such as an epoxy resin. Not limited to a full mold structure in which a resin is injected under the die pad portion 2b, an insulation sheet or an insulation substrate may be provided under the die pad portion 2b and a heat sink may be provided further thereunder in the metal mold internal space before resin sealing.

Heaters (not shown) are buried in the upper mold surface plate 20 and the lower mold surface plate 30 to increase temperatures of the upper metal mold 21 and the lower metal mold 31. The resin injected into the metal mold internal space, after being pressurized, is cured by heat of the upper metal mold 21 and the lower metal mold 31 to become a transfer mold resin, so that the resin sealing step completes.

At the resin sealing step, provision of the suspension lead 2d which supports the die pad portion 2b suppresses rising and falling of the die pad portion due to pressure of the resin being injected.

At a lead cutting step after the resin sealing step, the tie bar 2c, the partition frame 2f, the suspension lead 2d and the like are cut by punching. Such cutting separates the plurality of semiconductor devices, which are configured to have the plurality of electrode terminals 2a electrically independent from each other between the electrode terminals and extending on the upper surfaces of the semiconductor elements, into individual semiconductor devices to complete such a semiconductor device as shown in FIG. 2.

At the time of cutting the suspension lead 2d, the suspension lead 2d may be pulled out from the resin 4 configuring the semiconductor device 100. Since the suspension lead 2d is pulled out from inside the resin and cut, an insulation distance from the front end portion of the electrode terminal to the suspension lead can be increased.

According to the manufacturing method of the semiconductor device of the first preferred embodiment, a lead frame with a suspension lead which supports a die pad portion is used, an electrode terminal portion is selectively cut out from a framework, and the cut out electrode terminal portion is bent so as to extend to a direction of an upper surface of a semiconductor element. This enables a plurality of semiconductor devices, which are configured to have an electrode terminal extending to the direction of the upper surface of the semiconductor element, to be collectively manufactured by using a single lead frame from a die bonding step to the resin sealing step, in particular, from a lead forming step to a resin sealing step. Additionally, use of the framework at each of the above steps achieves conveyance with ease to have an effect of improving production efficiency.

The present invention allows the exemplary embodiments and the modification to be freely combined or appropriately modified or omitted within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A manufacturing method of a semiconductor device comprising:
    a die bonding step of bonding a semiconductor element to a die pad of a lead frame which includes a plurality of circuit patterns which each have said die pad and an electrode terminal portion provided around said die pad and are disposed in a band shape; a tie bar which connects a plurality of electrode terminals configuring said electrode terminal portion and extends in a disposition direction of said circuit patterns; a frame portion which has a partition frame between said circuit patterns, is connected to said plurality of electrode terminals and both end portions of said tie bar and is arranged so as to surround said circuit patterns; and a suspension lead which connects said frame portion and said die pad in the disposition direction of said circuit patterns;
    a wire bonding step of electrically connecting said semiconductor element and said plurality of electrode terminals by a metal wire;
    a lead forming step of cutting a connection portion between end portions of said plurality of electrode terminals and said frame portion, a connection portion between said frame portion and said tie bar at both end portions in the disposition direction of said circuit patterns, and a connection portion from a connection part of said frame portion with said tie bar, the part being between said circuit patterns, to a part of said frame portion extending in the disposition direction of said circuit patterns, and bending a part of said electrode terminal portion between said tie bar and said die pad to make an end portion of said electrode terminal portion including said tie bar extend in a direction to which an upper surface of said semiconductor element faces;
    a resin sealing step of sealing said lead frame with a resin so that a part of said electrode terminal portion, the part being positioned above said tie bar in the direction to which the upper surface of said semiconductor element faces, and said tie bar are exposed; and
    a lead cutting step of cutting between said circuit patterns to be separated into the individual semiconductor device.

2. The manufacturing method of a semiconductor device according to claim 1, wherein at said resin sealing step, the lead frame subjected to said lead forming step is arranged inside a metal mold, a part exposed to the outside of said metal mold through a terminal hole is clamped by a movable clamp to hold a part including said tie bar, the terminal hole being provided in an upper portion of said metal mold and having a rectangular opening extending in the disposition direction of said circuit patterns, and a front end portion of said movable clamp is engaged in said terminal hole.

3. The manufacturing method of a semiconductor device according to claim 1, wherein said suspension lead is provided with a step parallel to a direction orthogonal to the disposition direction of said circuit patterns.

4. The manufacturing method of a semiconductor device according to claim 1, wherein said suspension lead has a thickness of 0.4 to 0.7 mm and a width of 10 to 20 mm in a direction orthogonal to the disposition direction of said circuit patterns.

5. The manufacturing method of a semiconductor device according to claim 1, wherein
    the resin has an upper exposed surface that extends over said lead frame; and
    said electrode terminal portion of said lead frame protrudes from the upper exposed surface of said resin after said lead frame is sealed with said resin during the resin sealing step.

6. The manufacturing method of a semiconductor device according to claim 1, wherein said electrode terminal portion includes a bent portion that directs said electrode terminal portion to protrude from the upper exposed surface of said resin.

7. A manufacturing method of a semiconductor device comprising:

a die bonding step of bonding a semiconductor element to a die pad of a lead frame which includes a plurality of circuit patterns which each have said die pad and an electrode terminal portion provided around said die pad and are disposed in a band shape; a frame portion arranged so as to connect with said electrode terminal portion and surround said electrode terminal portion and said die pad; and a suspension lead which connects said frame portion and said die pad;

a wire bonding step of electrically connecting said semiconductor element and said electrode terminal portion by a metal wire;

a lead forming step of cutting a connection part between said electrode terminal portion and said frame portion and bending said electrode terminal portion to extend in a direction to which an upper surface of said semiconductor element faces;

a resin sealing step of sealing said lead frame with a resin so that a part of said electrode terminal portion is exposed, the part being positioned in the direction to which the upper surface of said semiconductor element faces; and a lead cutting step of cutting between said circuit patterns to be separated into the individual semiconductor device.

8. The manufacturing method of a semiconductor device according to claim 7, wherein at said resin sealing step, the lead frame subjected to said lead forming step is arranged inside a metal mold, a part exposed to the outside of said metal mold through a terminal hole is clamped by a movable clamp to hold a part including said tie bar, the terminal hole being provided in an upper portion of said metal mold and having a rectangular opening extending in the disposition direction of said circuit patterns, and a front end portion of said movable clamp is engaged in said terminal hole.

9. The manufacturing method of a semiconductor device according to claim 7, wherein said suspension lead is provided with a step parallel to a direction orthogonal to a disposition direction of said circuit patterns.

10. The manufacturing method of a semiconductor device according to claim 7, wherein the resin has an upper exposed surface that extends over said lead frame; and said electrode terminal portion of said lead frame protrudes from the upper exposed surface of said resin after said lead frame is sealed with said resin during the resin sealing step.

11. The manufacturing method of a semiconductor device according to claim 7, wherein said electrode terminal portion includes a bent portion that directs said electrode terminal portion to protrude from the upper exposed surface of said resin.

12. A semiconductor device comprising:

a lead frame having a die pad bonded to a back surface of a semiconductor element and covered with a single resin along with said semiconductor element, the single resin having an upper exposed surface that extends over the lead frame;

wherein an electrode terminal portion of said lead frame is configured to protrude from the upper exposed surface of said resin to extend in a direction to which a top surface of said semiconductor element faces.

13. The semiconductor device according to claim 12, wherein the electrode terminal portion includes a bent portion covered by said resin that directs the electrode terminal portion to protrude from the upper exposed surface of said resin.

14. The semiconductor device according to claim 12, further comprising a circuit pattern that extends in a disposition direction on said lead frame; and a suspension lead which connects said lead frame and said die pad; and wherein said suspension lead is provided with a step parallel to a direction orthogonal to the disposition direction of said circuit pattern.

* * * * *